US009336863B2

(12) United States Patent
Jung et al.

(10) Patent No.: US 9,336,863 B2
(45) Date of Patent: May 10, 2016

(54) DUAL WRITE WORDLINE MEMORY CELL

(71) Applicants: QUALCOMM Incorporated, San Diego, CA (US); Industry-Academic Cooperation Foundation, Yonsei University, Seoul (KR)

(72) Inventors: Seong-Ook Jung, Seoul (KR); Younghwi Yang, Seoul (KR); Stanley Seungchul Song, San Diego, CA (US); Choh Fei Yeap, San Diego, CA (US); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/320,024

(22) Filed: Jun. 30, 2014

(65) Prior Publication Data

US 2015/0380080 A1    Dec. 31, 2015

(51) Int. Cl.
| G11C 11/417 | (2006.01) |
| G11C 5/06 | (2006.01) |
| G11C 7/00 | (2006.01) |
| G11C 8/16 | (2006.01) |
| G11C 5/02 | (2006.01) |
| G11C 11/419 | (2006.01) |
| G11C 11/412 | (2006.01) |
| G11C 8/14 | (2006.01) |
| G11C 7/20 | (2006.01) |

(52) U.S. Cl.
CPC .............. *G11C 11/419* (2013.01); *G11C 8/14* (2013.01); *G11C 11/412* (2013.01); *G11C 5/02* (2013.01); *G11C 7/00* (2013.01); *G11C 7/20* (2013.01); *G11C 8/16* (2013.01); *G11C 11/417* (2013.01)

(58) Field of Classification Search
CPC .......... G11C 11/417; G11C 8/16; G11C 5/06; G11C 11/412; G11C 7/00; G11C 5/02
USPC ................. 365/72, 154, 155, 156, 230.05
See application file for complete search history.

(56) References Cited

U.S. PATENT DOCUMENTS

| 7,729,159 | B2 | 6/2010 | Braceras et al. |
| 8,625,333 | B2 | 1/2014 | Rao et al. |
| 2001/0046173 | A1 | 11/2001 | Yoshikoshi |
| 2003/0227041 | A1* | 12/2003 | Atwood et al. ............... 257/296 |
| 2006/0215465 | A1* | 9/2006 | Bhavnagarwala et al. .................. 365/189.12 |
| 2007/0025169 | A1* | 2/2007 | Houston ....................... 365/206 |
| 2007/0041239 | A1 | 2/2007 | Takeda |
| 2008/0019194 | A1* | 1/2008 | Katayama ................ G11C 7/02 365/189.15 |

(Continued)

OTHER PUBLICATIONS

Nalam, S. et al., "5T SRAM With Asymmetric Sizing for Improved Read Stability," IEEE Journal of Solid-State Circuits, Oct. 2011, vol. 46, No. 10, IEEE, Piscataway, NJ, pp. 1-12.

(Continued)

*Primary Examiner* — Ly D Pham
(74) *Attorney, Agent, or Firm* — Toler Law Group

(57) ABSTRACT

A static random-access memory (SRAM) memory cell includes a pair of cross-coupled inverters and a gating transistor coupled to a first node of a first inverter of the pair of cross-coupled inverters. A gate of the gating transistor is coupled to a first wordline. The gating transistor is configured to selectively couple a bitline to the first node of the first inverter responsive to a first wordline signal. The first inverter has a second node coupled to a second wordline. The first wordline and the second wordline are each independently controllable.

30 Claims, 6 Drawing Sheets

(56) References Cited

U.S. PATENT DOCUMENTS

| | | |
|---|---|---|
| 2008/0158938 A1 | 7/2008 | Burnett et al. |
| 2008/0266936 A1* | 10/2008 | Kanari .................. 365/154 |
| 2009/0168496 A1* | 7/2009 | Mikan et al. ............ 365/154 |
| 2010/0172194 A1 | 7/2010 | Chang et al. |
| 2011/0044094 A1* | 2/2011 | Houston .................. 365/154 |
| 2011/0085389 A1* | 4/2011 | Khellah et al. ........ 365/189.11 |
| 2011/0149661 A1 | 6/2011 | Rajwani et al. |
| 2012/0113708 A1 | 5/2012 | Jung et al. |
| 2013/0083591 A1 | 4/2013 | Wuu et al. |
| 2013/0194860 A1 | 8/2013 | Cheng |

OTHER PUBLICATIONS

Tu, M.-H. et al., "Single-Ended Subthreshold SRAM With Asymmetrical Write/Read-Assist," IEEE Transactions on Circuits and Systems-I: Regular Papers, Dec. 2010, vol. 57, No. 12, IEEE, Piscataway, NJ, pp. 3039-3047.

Sinangil, M. et al., "A Reconfigurable 8T Ultra-Dynamic Voltage Scalable (U-DVS) SRAM in 65 nm CMOS," IEEE Journal of Solid-State Circuits, Nov. 2009, vol. 44, No. 11, IEEE, Piscataway, NJ, pp. 3163-3173.

International Search Report and Written Opinion—PCT/US2015/034160—ISA/EPO—Sep. 21, 2015.

* cited by examiner

DUAL WRITE WORDLINE MEMORY CELL

I. FIELD

The present disclosure is generally related to a dual write wordline memory cell.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A computing device may include a memory (e.g., random access memory (RAM)) to store data. The memory may include memory cells as storage elements. Data errors may occur at the memory, causing data read from the memory to differ from data written to the memory. A data error at a particular memory cell may occur when a value is written to another memory cell that shares a common wordline or a common bitline with the particular memory cell. When the common wordline or the common bitline is used to send signals to the other memory cell, transistors at the particular memory cell may trigger and may modify data stored at the particular memory cell. This type of error is referred to as a half-select error.

III. SUMMARY

A seven transistor (7T) static random-access memory (SRAM) memory cell that utilizes a single write bitline and two independently controlled write wordlines is disclosed. The 7T memory cell may use a two-phase write operation during memory write operations. For example, during a memory write operation, a first write wordline (WWL1) may be used to select a row of 7T memory cells (and their associated gating transistors) and a second write wordline (WWL2), and a write bitline (WBL) may be used to write a value to the memory cells of the selected row. In a particular embodiment, a first phase of the two-phase write operation may write a logical "1" value (e.g., a "high" value) to the memory cells of the selected row. In a second phase of the two-phase write operation, a logical "0" value (e.g., a "low" value) may be selectively written to memory cells that are to store a logical "0" value.

In a particular embodiment, an SRAM memory cell includes a pair of cross-coupled inverters. The SRAM memory cell also includes a gating transistor coupled to a first node of a first inverter of the pair of cross-coupled inverters. The gating transistor has a gate that is coupled to a first wordline. The gating transistor is configured to selectively couple a bitline to the first node of the first inverter responsive to a first wordline signal. The first inverter has a second node coupled to a second wordline. The first wordline and the second wordline are each independently controllable.

In another particular embodiment, a method includes, during a first phase of a write operation of a memory cell that includes a pair of cross-coupled inverters, applying a first signal to a first wordline to selectively couple a bitline to a first node of a first inverter of the pair of cross-coupled inverters. The method also includes, during the first phase of the write operation, applying a second signal to a second wordline that is coupled to a second node of the first inverter. The first signal is independently generated from the second signal. The method also includes, during the first phase of the write operation, applying a third signal to the bitline.

In another particular embodiment, an apparatus includes a first means for inverting. The apparatus also includes a second means for inverting. The first means for inverting and the second means for inverting are cross-coupled. The apparatus also includes a means for switching coupled to a first node of the first means for inverting. A control input of the means for switching is coupled to a first wordline. The means for switching selectively couples a bitline to the first node of the first means for inverting responsive to a first wordline signal. The first means for inverting has a second node coupled to a second wordline. The first wordline and the second wordline are each independently controllable.

In a particular embodiment, a non-transitory computer readable medium storing instructions. The instructions are executable by the processor to cause the processor to, during a first phase of a write operation of a memory cell that includes a pair of cross-coupled inverters, initiate application of a first signal to a first wordline to selectively couple a bitline to a first node of a first inverter of the pair of cross-coupled inverters. The processor may also, during the first phase of the write operation, initiate application of a second signal to a second wordline that is coupled to a second node of the first inverter, where the first signal is independently generated from the second signal. The processor may also, during the first phase of the write operation, initiate application of a third signal to the bitline.

One particular advantage provided by at least one of the disclosed embodiments is reduced dynamic power consumption without degrading the data hold stability of a memory cell (e.g., column half selected cells). For example, an eight transistor (8T) memory cell may be susceptible to half select error for half-selected memory cells of a selected memory row during write operations. To compensate for the half select error, a write-back scheme (also referred to as a "read-modify-write" scheme) may be used. However, the write-back scheme applied to an 8T memory cell may result in a significant increase in total write power, which includes the bitline power used during the read operation, the bitline power used to write back to unselected cells, and the bitline power used to write to the selected cell. To address the power consumption associated with an 8T write-back scheme, a single write bitline structure for the memory cell may be used. However, the single write bitline structure may be unable to write a "strong" logical "1" for write operations. By contrast, a dual write wordline memory cell that uses a two-phase write operation may provide proper write operations in the single write bitline structure without degrading data read/hold stability of a memory cell and may provide reduced power consumption for write operation of a memory cell.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
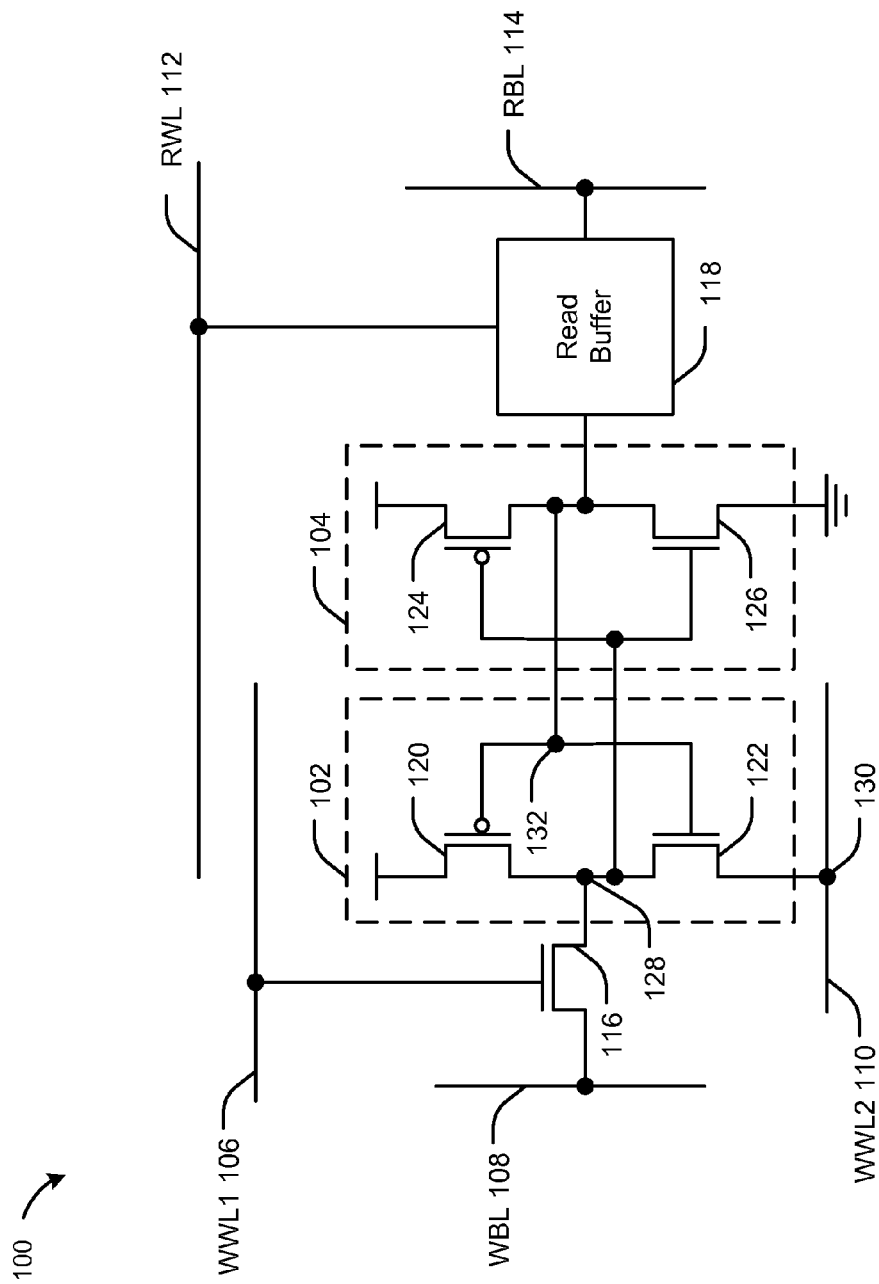
FIG. 1 is a block diagram that illustrates a particular embodiment of a dual write wordline memory cell.

Referring to FIG. 1, a particular illustrative embodiment of a dual write wordline memory cell 100 is shown. The dual write wordline memory cell 100 includes a first inverter 102, a second inverter 104, a first write wordline 106, a write bitline 108, a second write wordline 110, a read wordline 112, a read bitline 114, a gating transistor 116, and a read buffer 118. The first inverter 102 may include a first p-type metal-oxide-semiconductor (PMOS) transistor 120 coupled in series with a first n-type metal-oxide-semiconductor (NMOS) transistor 122. The second inverter 104 may include a second PMOS transistor 124 coupled in series with a second NMOS transistor 126. The first inverter 102 may be cross-coupled with the second inverter 104 to form a pair of cross-coupled inverters. For example, an input of the first inverter 102 may be coupled to an output of the second inverter 104 and an input of the second inverter 104 may be coupled to an output of the first inverter 102. The first inverter 102 and the second inverter 104 may together store a data value (e.g., a data value of the dual write wordline memory cell 100). The pair of cross-coupled inverters, the first transistor, and the read buffer may correspond to a single write bitline memory cell architecture. The dual write wordline memory cell 100 may be part of a row of a memory array, as described below with reference to FIG. 2.

The gating transistor 116 may include a NMOS transistor or a PMOS transistor. The gating transistor 116 may have a gate terminal coupled to the first write wordline 106. Thus, the gating transistor 116 may be responsive to the first write wordline 106. Based on a signal from the first write wordline 106, the gating transistor 116 may selectively couple the write bitline 108 to a first node 128 that corresponds to the input of the second inverter 104 (and to the output of the first inverter 102). When the write bitline 108 is coupled to the input of the second inverter 104, the write bitline 108 may cause the first inverter 102 and the second inverter 104 to store a value (e.g., a memory cell data value).

The second write wordline 110 may be coupled to a source terminal of a transistor of the first inverter 102 (e.g., to a source terminal of the first PMOS transistor 120 or to a source terminal of the first NMOS transistor 122). The second write wordline 110 may be used to selectively apply a signal to the source terminal of the transistor of the first inverter 102. The second write wordline 110 and the first write wordline 106 may be independently controllable. In a first embodiment, as illustrated in FIG. 1, the gating transistor 116 includes a NMOS transistor with a gate terminal coupled to the first write wordline 106, the second write wordline 110 is coupled to a second node 130 that corresponds to a source terminal of the first NMOS transistor 122, and the drain terminal of the first NMOS transistor 122 is coupled to the gating transistor 116 that is coupled to the first node 128. In a second embodiment, the gating transistor 116 includes a PMOS transistor and the second write wordline 110 is coupled to a source terminal of the first PMOS transistor 120.

During operation, a two-phase write operation may be performed at the dual write wordline memory cell 100. In a first embodiment, a first phase of the two-phase write operation may include writing a logical "1" value to the dual write wordline memory cell 100 (e.g., regardless of data to be stored at the dual write wordline memory cell 100). In the first embodiment, a second phase of the two-phase write operation may include selectively writing a logical "0" to the dual write wordline memory cell 100 based on a corresponding data value (e.g., a data value received from an execution unit). The corresponding data value may be received from a processing device and may correspond to a value (e.g., a memory cell data value) to be stored at the dual write wordline memory cell 100. Thus, the second phase of the write operation may be different from memory cell to memory cell at the dual write wordline memory cell 100 based on the corresponding data value. In the second embodiment, the first phase of the two-phase write operation may include writing a logical "0" value to the dual write wordline memory cell 100. In the second embodiment, the second phase of the two-phase write operation may include selectively writing a logical "1" to the dual write wordline memory cell 100 based on the corresponding data value.

To illustrate, in the first embodiment, during a first phase of the write operation, a logical "1" value is written to the dual write wordline memory cell 100. The logical "1" value may be written by providing a select signal to the first write wordline 106 (e.g., a first signal), and providing signals (e.g., voltages) corresponding to a logical "1" value to the second write wordline 110 (e.g., a second signal), and to the write bitline 108 (e.g., a third signal). Thus, the gating transistor 116 may be enabled and the write bitline 108 may send the logical "1" to the first node 128. When, prior to the first phase of the write operation, the input of the second inverter 104 is a logical "0" value, the first NMOS transistor 122 may be enabled. When the first NMOS transistor 122 is enabled, the first NMOS transistor 122 may send a value of the second write wordline 110 (e.g., a logical "1" value) from the second node 130 to the first node 128. Thus, when the data value of the input of the second inverter 104 is changed from a logical "0" value to a logical "1" value, both the gating transistor 116 and the first NMOS transistor 122 may send a logical "1" value to the first node 128. Sending the logical "1" value to the first node 128 using both the gating transistor 116 and the first NMOS transistor 122 may change a value at the input of the second inverter 104 more quickly and with less average leakage current, as compared to sending the logical "1" value to the first node 128 using only the gating transistor 116. In the second embodiment, during the first phase of the write operation, a logical "0" value is written to the dual write wordline memory cell 100 (e.g., to the first node 128) instead of a logical "1" value.

In the first embodiment, during a second phase of the write operation, after the logical "1" value has been written to the dual write wordline memory cell 100, a logical "0" value may be selectively written to the dual write wordline memory cell 100 based on the corresponding data value. The logical "0" may be written by providing signals (e.g., voltages) corresponding to a logical "0" value to the second write wordline 110 (e.g., a fourth signal) and to the write bitline 108 (e.g., a fifth signal). For example, when the corresponding data value is a logical "0," signals corresponding to a logical "0" value may be sent from the write bitline 108 to the first node 128. In this example, when the corresponding data value is a logical "1," a logical "0" value is not sent from the write bitline 108 to the input of the second inverter 104. In the second embodiment, during the second phase of the write operation, after the logical "0" value has been written to the dual write wordline memory cell 100, a logical "1" value is selectively written to the input of the second inverter 104 instead of a logical "0" value.

The read buffer 118, the read wordline 112, and the read bitline 114 may be used to perform a read operation at the dual write wordline memory cell 100. The read buffer 118 may be coupled to a third node 132 of the first inverter 102 (e.g., corresponding to an input of the first inverter 102). During operation, a value at the read wordline 112 may indicate a read request corresponding to the dual write wordline memory cell 100. Based on the value at the read wordline 112 and a value at the third node 132, the read buffer 118 may cause a value at the read bitline 114 to correspond to a value at the first node 128. In a particular embodiment, the read buffer 118 includes two transistors (e.g., NMOS transistors) coupled to a source voltage (e.g., a ground voltage). In the particular embodiment, the dual write wordline memory cell 100 corresponds to a seven-transistor memory cell architecture.

By utilizing the two-phase write operation with the dual write wordline memory cell 100, a reduction in write power consumption may be achieved and the data hold stability of the memory cell may be maintained. Additionally, by applying the two-phase write operation to the dual write wordline memory cell 100, a reduction in bitline current leakage may be achieved during write operations.

Figure 2:
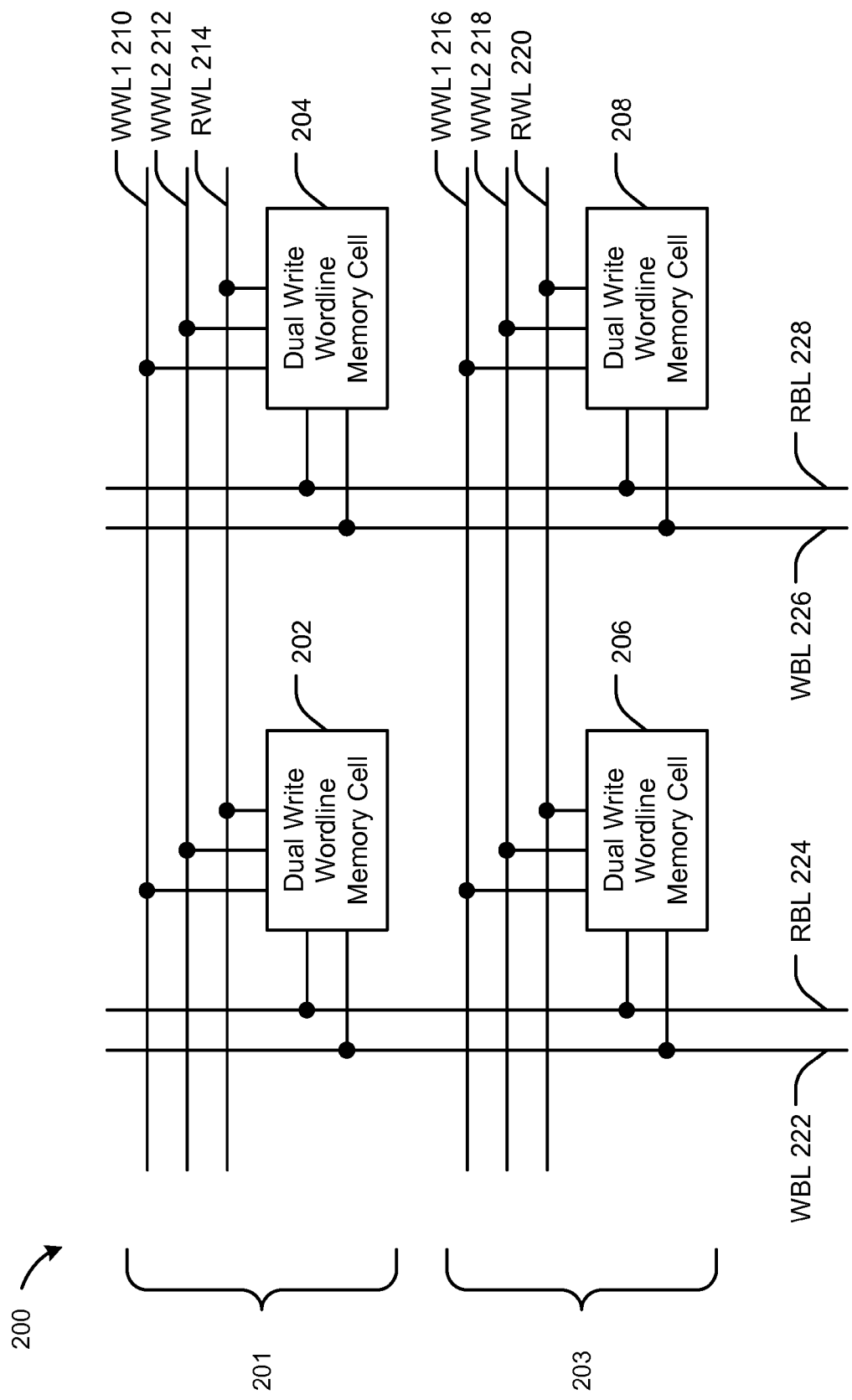
FIG. 2 is a diagram depicting a particular embodiment of a portion of a memory device including a dual write wordline memory cell.

Referring to FIG. 2, details of a particular embodiment of a portion of a memory device 200 that includes a dual write wordline memory cell is shown and generally designated 200. The memory device 200 may be a static random-access memory (SRAM). The memory device 200 may include one or more dual write wordline memory cells (e.g., dual write wordline memory cells 202, 204, 206, or 208 of FIG. 2) that may form part of an array of dual write wordline memory cells (i.e., the "memory array"). The dual write wordline memory cells 202, 204, 206, and 208 may each correspond to the dual write wordline memory cell 100 of FIG. 1.

A first row 201 of the portion of the memory array of the memory device 200 may include a dual write wordline memory cell 204 (e.g., the dual write wordline memory cell 100 of FIG. 1). The dual write wordline memory cell 204 may share a first write wordline 210 (e.g., the first write wordline 106 of FIG. 1), a second write wordline 212 (e.g., the second write wordline 110 of FIG. 1), and a first read wordline 214 (e.g., the read wordline 112 of FIG. 1) with other dual write wordline memory cells (e.g., a dual write wordline memory cell 202) of the first row 201 of the memory array. The dual write wordline memory cell 204 may also share a first write bitline 226 (e.g., the write bitline 108 of FIG. 1) and a first read bitline 228 (e.g., the read bitline 114 of FIG. 1) with other dual write wordline memory cells (e.g., a dual write wordline memory cell 208) of a column of memory cells of the memory array.

A second row 203 of the portion of the memory array may include a dual write wordline memory cell 208 (e.g., the dual write wordline memory cell 100 of FIG. 1). The dual write wordline memory cell 208 may share a third write wordline 216 (e.g., the write wordline 106 of FIG. 1), a fourth write wordline 218 (e.g., the write wordline 110 of FIG. 1), and a second read wordline 220 (e.g., the read wordline 112 of FIG. 1) with other dual write wordline memory cells (e.g., a dual write wordline memory cell 206) of the second row 203 of memory cells of the memory array. The dual write wordline memory cell 208 may also share the first write bitline 226 and the first read bitline 228 with other dual write wordline memory cells (e.g., a dual write wordline memory cell 204) of a column of memory cells of the memory array.

During operation, a two-phase write operation may be performed at a selected row of the memory array, the selected row including one or more of a dual write wordline memory cell. The two-phase write operation may be performed at dual write wordline memory cells of more than one selected row. For example, when the first row 201 is selected (e.g., when a select signal is applied to write wordline 210), the two-phase write operation may be performed at the dual write wordline memory cells 204 and 202 of the first row 201. In a first embodiment, a first phase of the two-phase write operation may include writing a logical "1" value to every cell of the first row (e.g., regardless of data to be stored at each cell).

For example, the first phase may include providing a select signal to the first write wordline 210 (e.g., a first signal at 106 of FIG. 1), and providing signals (e.g., voltages) corresponding to a logical "1" value to the second write wordline 212 (e.g., a second signal at 110 of FIG. 1), and to the write bitlines 226 and 222 (e.g., a third signal at write bitline 108 of FIG. 1). Thus, gating transistors of each of the dual write wordline memory cells 202 and 204 of the first row 201 may send a logical "1" value to a first node of a first inverter.

To illustrate, prior to the first phase write operation, if the dual write wordline memory cells 204 and 202 both store a logical "0" value, application of the first phase write operation may write a logical "1" value to the dual write wordline memory cells 204 and 202, regardless of the data to be stored at each cell.

In the first embodiment, a second phase of the two-phase write operation may include selectively writing a logical "0" to memory cells of the first row 201 based on a corresponding data value of multiple data values. The multiple data values may be received from a processing device and may include a value (e.g., a memory cell data value) to be stored at each memory cell in the first row 201. Thus, the second phase of the write operation may be different for different cells of the row of memory cells.

To illustrate, for the first row 201, the second phase may include maintaining a select signal to the first write wordline 210 (e.g., a first signal at 106 of FIG. 1), selectively providing a signal corresponding to a logical "0" value to the second write wordline 212 (e.g., a fourth signal at 110 of FIG. 1), selectively providing a signal corresponding to a logical "0" value to the write bitline 222 (e.g., a sixth signal at write bitline 108 of FIG. 1), and selectively providing a signal corresponding to a logical "1" value to the write bitline 226 (e.g., a sixth signal at write bitline 108 of FIG. 1) based on corresponding data values associated with the dual write wordline memory cells 202 and 204. For example, the corresponding data value may be received from a processing device and may correspond to a value (e.g., a memory cell data value) to be stored at a particular dual write wordline memory cell (e.g., the dual write wordline memory cells 204 or 202). When the corresponding data value is a logical "0,"

signals corresponding to a logical "0" value may be sent to a particular dual write wordline memory cell. When the corresponding data value is a logical "1," signals corresponding to a logical "1" value may be sent to the particular dual write wordline memory cell.

To illustrate, prior to a first phase write operation, the dual write wordline memory cells 204 and 202 may both store a logical "0" value. For a particular write operation, where a logical "1" value is to be written to dual write wordline memory cell 204 and a logical "0" value is to be maintained at other memory cells (e.g., the dual write wordline memory cell 202) in the first row 201, application of the first phase write operation may write a logical "1" value to both dual write wordline memory cells 204 and 202. Thus, when the corresponding data value for the dual write wordline memory cell 204, received from a processing device, is a data value that corresponds to a logical "1" to be stored at the dual write wordline memory cell 204, application of the first phase write operation writes the corresponding data value to the dual write wordline memory cell 204. During the second phase write operation, to write a logical "0" value (e.g., based on the corresponding data value) to the dual write wordline memory cell 202, a logical "0" value may be selectively written to the dual write wordline memory cell 202 via a signal (e.g., voltage) corresponding to a logical "0" value applied to the write bitline 222. During the second phase write operation, a logical "1" value may be selectively written to the dual write wordline memory cell 204 via a signal (e.g., voltage) corresponding to a logical "1" value applied to the write bitline 226.

Thus, in a first embodiment, the first phase write operation may write a logical "1" to all cells of the selected row, regardless of data to be stored at each cell. The second phase write operation may selectively write a logical "0" to one or more selected memory cells of the selected row based on data to be stored at the one or more memory cells. In a second embodiment, the first phase of the two-phase write operation may include writing a logical "0" value to every cell of the row. In the second embodiment, the second phase of the two-phase write operation may include selectively writing a logical "1" to one or more memory cells of the selected row based data to be stored at the one or more memory cells. Although two dual write wordline memory cells are illustrated in FIG. 2, the first row 201 may include more than two dual write wordline memory cells. When more than two dual write wordline memory cells are part of the first row 201, in the first embodiment, the first phase writes logical "1" to all memory cells and the second phase writes "0" to some memory cells.

In a particular embodiment, a read operation may be performed at the dual write wordline memory cells of a selected row of memory cells prior to the execution of a two-phase write operation. Additionally, a read operation may be performed at dual write wordline memory cells of more than one selected row. For example, prior to a two-phase write operation, a signal (e.g., voltage) may be provided at the read wordline 214 that may indicate a read request corresponding to the dual write wordline memory cells of the first row 201. Data values stored by the dual write wordline memory cells (e.g., dual write wordline memory cells 202 and 204) of the first row 201 may be read causing corresponding values to be sensed at read bitlines of the memory array (e.g., read bitline (RBL) 224 and RBL 228). In a particular embodiment, the read data values at the read bitlines (e.g., RBL 224 and RBL 228) may be latched or otherwise captured and may be used by a processing device for sending a corresponding data value for use in the second phase of the two-phase write operation of the dual write wordline memory cell.

Using the two-phase write operation as part of a write operation of a memory array may enable the maintenance of data hold stability for both selected and half-selected memory cells of a selected row. Additionally, by using the two-phase write operation with the dual write wordline memory cell, a capacitance to be toggled during a write operation may be reduced and may enable a reduction in switching power during write operations.

Figure 3:
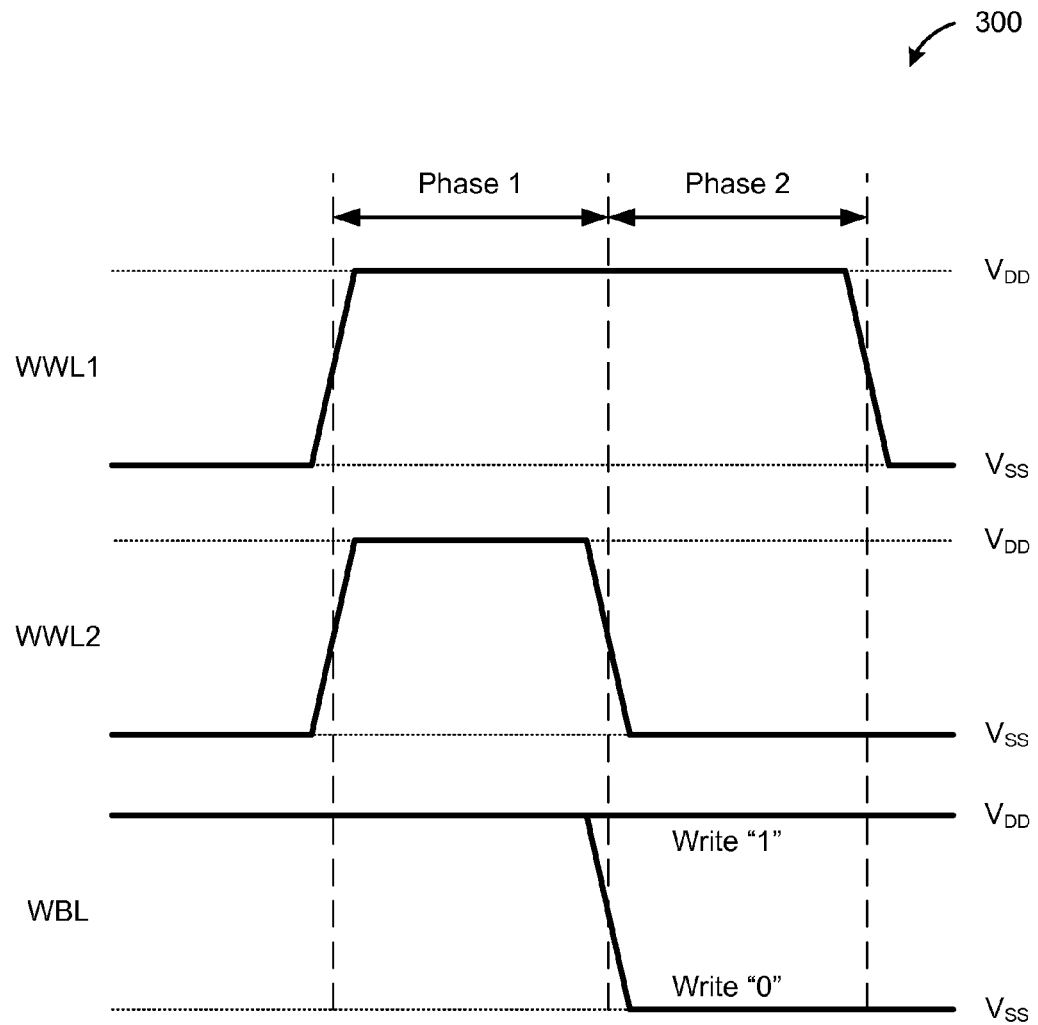
FIG. 3 is a timing diagram that illustrates write operation input signals of a particular embodiment of a dual write wordline memory cell.

Referring to FIG. 3, additional detail of the operation of a memory cell, such as the dual write wordline memory cell 100, during a first embodiment of a two-phase write operation is shown in the graph 300. FIG. 3 illustrates a graph 300 of signals at a first write wordline (WWL1), at a second write wordline (WWL2), and at a write bitline (WBL). The WWL1 may correspond to the first write wordline 106 of FIG. 1 or the first write wordline 210 of FIG. 2. The WWL2 may correspond to the second write wordline 110 of FIG. 1 or the second write wordline 212 of FIG. 2. The WBL may correspond to the write bitline 108 of FIG. 1 or the write bitlines 222 or 226 of FIG. 2.

As illustrated by the graph 300, during a first phase of the write operation, signals corresponding to a logical "1" value are applied at the WWL1 (e.g., a first signal), at the WWL2 (e.g., a second signal), and at the WBL (e.g., a third signal). For example, referring to FIG. 1, application of a logical "1" at the WWL1 may enable the gating transistor 116 to couple a signal applied to the WBL 108 to the first node 128 of the first inverter 102. Thus, the WBL 108 provides a logical "1" value to the first node 128 of the first inverter 102. Prior to the first phase of the write operation, if the input of the second inverter 104 is a logical "0" value, the first NMOS transistor 122 may be enabled. Thus, the first NMOS transistor 122 provides the logical "1" value applied at the WWL2 110 from the second node 130 to the first node 128. Accordingly, when the WWL1, the WWL2, the WBL and the data value of the output of the second inverter 104 have a logical "1" value, both the gating transistor 116 and the first NMOS transistor 122 may send a logical "1" value to the first node 128.

As illustrated by the graph 300, during a second phase of the two-phase write operation, a signal corresponding to a logical "1" value may be applied to the WWL1 (e.g., the first signal) and a signal corresponding to a logical "0" value may be applied to the WWL2 (e.g., a fourth signal). A value applied to the WBL depends on a corresponding data value to be stored at the particular memory cell. When the corresponding data value (e.g., a value received from a processing device) is a logical "0", a signal corresponding to a logical "0" may be selectively applied to the WBL (e.g., a fifth signal). For example, referring to FIG. 1, a logical "0" may be applied to the WWL2 110. Application of a logical "1" at the WWL1 may enable the gating transistor 116 to couple a signal applied to the WBL 108 to the first node 128 of the first inverter 102. A logical "0" may be selectively applied to the WBL based on a data value that corresponds to writing a logical "0" value (e.g., Write "0") to the dual write wordline memory cell (e.g., the dual write wordline memory cell 100 of FIG. 1, or the dual write wordline memory cells 202, 204, 206, 208 of FIG. 2). When the corresponding data value is a logical "1", a logical "1" may be selectively applied to the WBL to write a logical "1" value (e.g., Write "1") to the dual write wordline memory cell (e.g., the dual write wordline memory cell 100 of FIG. 1, or the dual write wordline memory cells 202, 204, 206, 208 of FIG. 2). Thus, when WWL1 has a logical "1" value and WWL2 has a logical "0" value, WBL may selectively send either a logical "0" value or a logical "1" value to the first node 128 based on a data value that corresponds to either a Write "0" or a Write "1" to the dual write wordline memory cell, respectively.

In a particular embodiment, one or both of wordlines WWL1 and WWL2 may be voltage "boosted" to improve performance of write operations. For example, the first signal, the second signal, or both the first and the second signal may be voltage-boosted signals (i.e., >Vdd) that may be applied at wordlines WWL1 and WWL2. In a particular embodiment, a voltage-boosted signal that is greater than Vdd may be applied to both WWL1 and WWL2. In another embodiment, the voltage-boosted signal applied to the WWL1 may be a voltage greater than Vdd, and the voltage-boosted signal applied to the WWL2 may be a voltage less than Vss. Control of wordlines WWL1 and WWL2 in the row direction may enable voltage boosting while avoiding the column-select issue that may occur at memory cells of a selected row.

Figure 4:
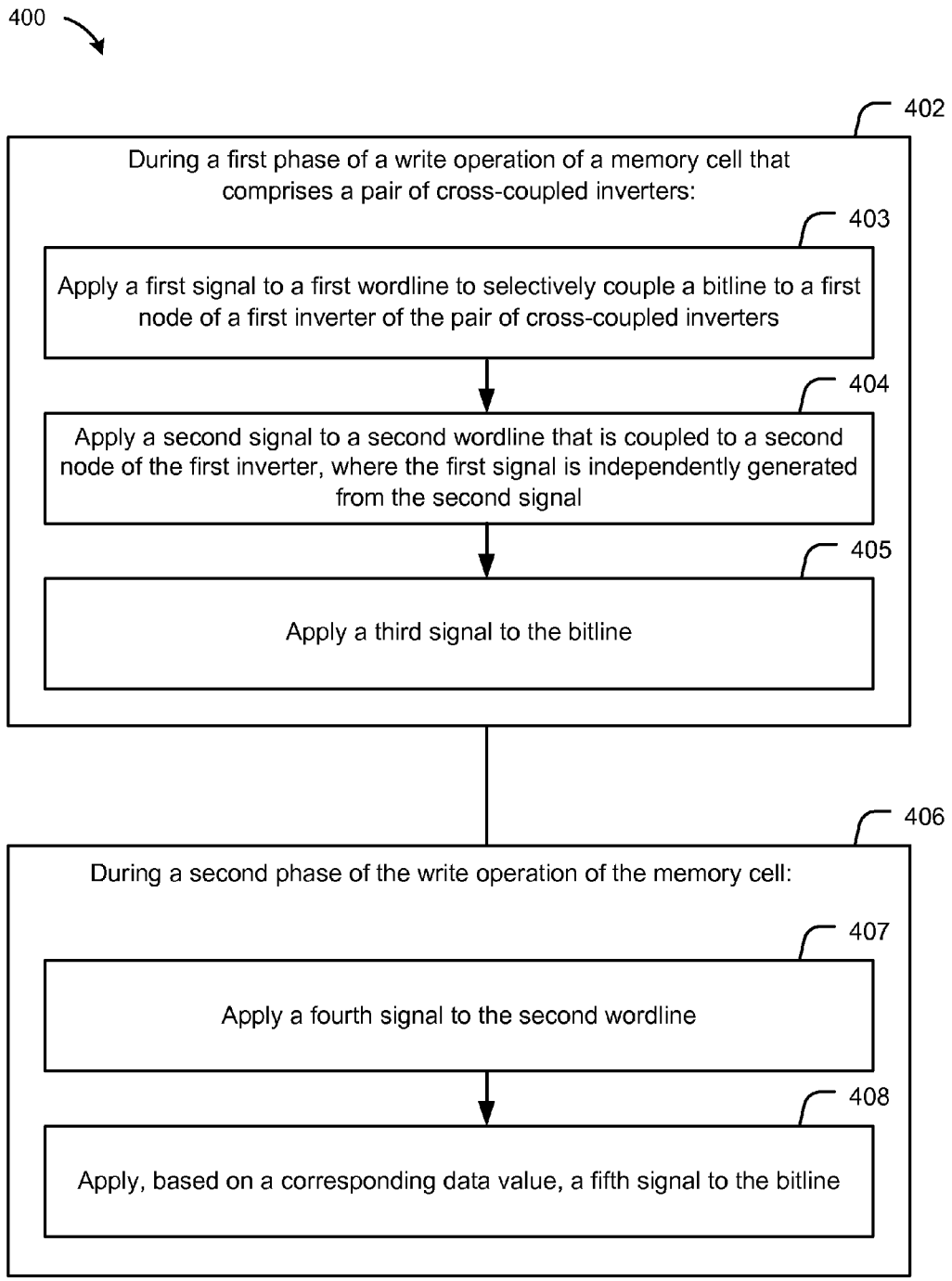
FIG. 4 is a flow chart that illustrates a particular embodiment of a method of operating a dual write wordline memory cell.

Referring to FIG. 4, a particular embodiment of a method 400 of operating a dual write wordline memory cell is shown. The method 400 may be applied to an SRAM dual write wordline memory cell. The method 400 may, for example, be applied to the dual write wordline memory cell 100 of FIG. 1. In another example, the method 400 may be applied to the dual write wordline memory cells (e.g., the dual write wordline memory cells 202, 204, 206, 208) that form part of the memory array of the memory device 200 of FIG. 2. The method 400 may be executed by the memory device 200 of FIG. 2 and/or the communication device 500 of FIG. 5.

The method 400 may include a first phase of a write operation of a memory cell that includes a pair of crossed-coupled inverters, at 402. During the first phase 402, the method 400 may include applying a first signal to a first wordline to selectively couple a bitline to a first node of a first inverter of the pair of cross-coupled inverters, at 403. For example, in a first embodiment, a signal (e.g., a voltage) corresponding to a logical "1" value may be provided to the first write wordline 106 of FIG. 1 to enable the gating transistor 116. When enabled, the gating transistor 116 couples the write bitline 108 to the first node 128 of the first inverter 102 of the pair of crossed-coupled inverters 102, 104.

During the first phase 402, the method 400 also includes applying a second signal to a second wordline that is coupled to a second node of the first inverter, where the first signal is independently generated from the second signal, at 404. For example, in a first embodiment, a second signal (e.g., a voltage) corresponding to a logical "1" value may be provided to the second write wordline 110 of FIG. 1, which is coupled to the second node 130 of the first inverter 102. The second signal may have a voltage value that corresponds to a source voltage (e.g., Vdd) of the first inverter 102. The first signal may be generated independently from the second signal to enable the first signal to remain at a logical value (e.g., logical "1") in more than one phase (e.g., during the first phase and the second phase) while the second signal is changed for different phases based on a value to be stored at the dual write wordline memory cell 100 (e.g., a logical "1" during the first phase and a logical "0" during the second phase).

During the first phase 402, the method 400 also includes applying a third signal to the bitline, at 405. For example, in the first embodiment, a signal (e.g., a voltage) corresponding to a logical "1" value may be provided to a write bitline 108. Thus, during the first phase, a logical "1" value may be written to the dual write wordline memory cell 100 by providing signals (e.g., voltages) corresponding to a logical "1" value to the first write wordline 106 (e.g., the first signal), to the second write wordline 110 (e.g., the second signal), and to the write bitline 108 (e.g., the third signal).

The method 400 may include a second phase of a write operation of the memory cell, at 406. During the second phase 406, the method 400 may include applying a fourth signal to the second wordline, at 407. For example in a first embodiment, a signal (e.g., voltage) corresponding to a logical "0" value may be provided to the second write wordline 110.

During the second phase 406 the method 400 also includes applying, based on a corresponding data value, a fifth signal to the bitline, at 408. For example, after the logical "1" value has been written to the dual write wordline memory cell 100 during the first phase, a logical "0" value may be selectively provided to the write bitline 108 to selectively write a logical "0" value to the dual write wordline memory cell 100 based on a corresponding data value. In a particular embodiment, a logical "1" value may be selectively provided to the write bitline 108 to selectively write a logical "1" value to the dual write wordline memory cell 100 based on the corresponding data value.

Although the method 400 of FIG. 4 has been described above with regard to FIG. 1, the method 400 may also be performed by the memory device 200 of FIG. 2. The method 400 of FIG. 4 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 4 can be performed by a processor or memory controller that executes instructions, as described with respect to FIG. 5

Figure 5:
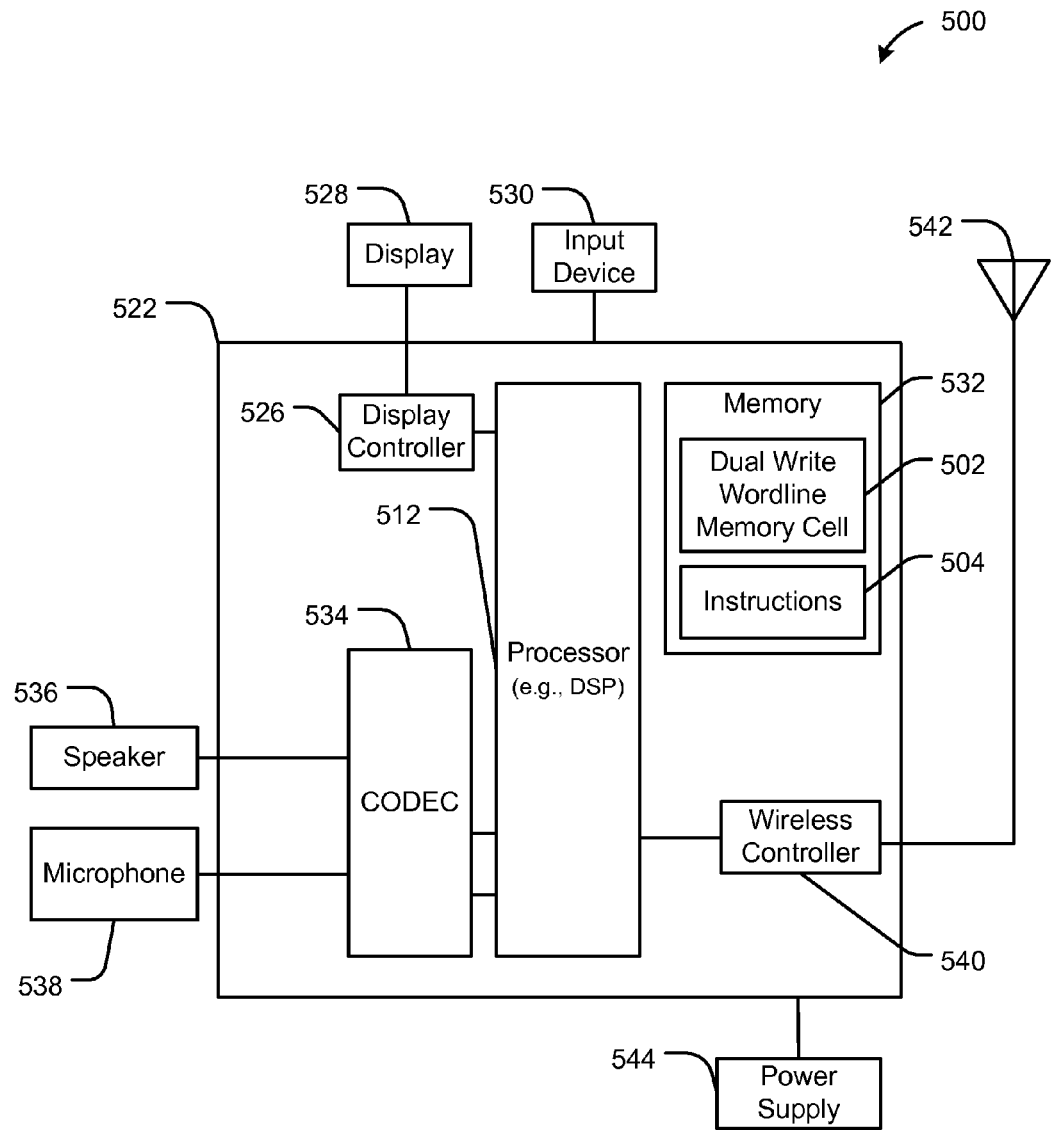
FIG. 5 is a block diagram that illustrates a particular embodiment of a communication device including a dual write wordline memory cell.

Referring to FIG. 5, a particular embodiment of a wireless communication device 500 including a dual write wordline memory cell 502 is shown. The communication device 500 includes a processor 512 (e.g., a DSP), coupled to a memory 532. The memory 532 includes one or more of a dual write wordline memory cell 502 as part of a memory array of the memory 532. In an illustrative embodiment, the dual write wordline memory cell 502 may correspond to the dual write wordline memory cell 100 of FIG. 1. In another illustrative embodiment, the memory 532 may include an array of dual write wordline memory cells, such as the dual write wordline memory cells 202, 204, 206 and 208 of FIG. 2.

The memory 532 may be a non-transient computer readable medium storing computer-executable instructions 504 that are executable by the processor 512 to cause the processor 512, during a first phase of a write operation of a memory cell that includes a pair of cross-coupled inverters, to initiate application of a first signal to a first write wordline (e.g., the write wordline 106 of FIG. 1) to selectively couple a write bitline (e.g., the write bitline 108 of FIG. 1) to a first node (e.g., the first node 128 of FIG. 1) of a first inverter (e.g., the first inverter 102 of FIG. 1) of the pair of cross-coupled inverters. The processor 512 may further initiate application of a second signal to a second write wordline (e.g., the write wordline 110 of FIG. 1) that is coupled to a second node (e.g., the second node 130 of FIG. 1) of the first inverter, where the first signal is independently generated from the second signal. The processor 512 may still further initiate application of a third signal to the write bitline (e.g., the write bitline 108 of FIG. 1).

FIG. 5 also shows a display controller 526 that is coupled to the processor 512 and to a display 528. A coder/decoder (CODEC) 534 can also be coupled to the processor 512. A speaker 536 and a microphone 538 can be coupled to the CODEC 534.

FIG. 5 also indicates that a wireless controller 540 can be coupled to the processor 512 and to an antenna 542. In a particular embodiment, the processor 512, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller.

In conjunction with the described embodiments, a system is disclosed that may include a pair of cross-coupled means for inverting, such as the pair of crossed-coupled inverters 102, 104 of FIG. 1, one or more other devices or circuits configured to cause inverting, or any combination thereof. The system may also include a first means for inverting, such as the first inverter 102 of FIG. 1, one or more other devices or circuits configured to cause switching, or any combination thereof. The system may also include means for switching, that is coupled to a first wordline, where the switching means selectively couples a bitline to the first node of the first means for inverting responsive to a first wordline signal, where the first means for inverting has a second node coupled to a second wordline, and where the first wordline and the second wordline are each independently controllable, such as the gating transistor 116 and the first inverter 102 of FIG. 1, one or more other devices or circuits configured to cause switching, or any combination thereof. The system may be integrated in at least one die and may be integrated into at least one electronic device.

Figure 6:
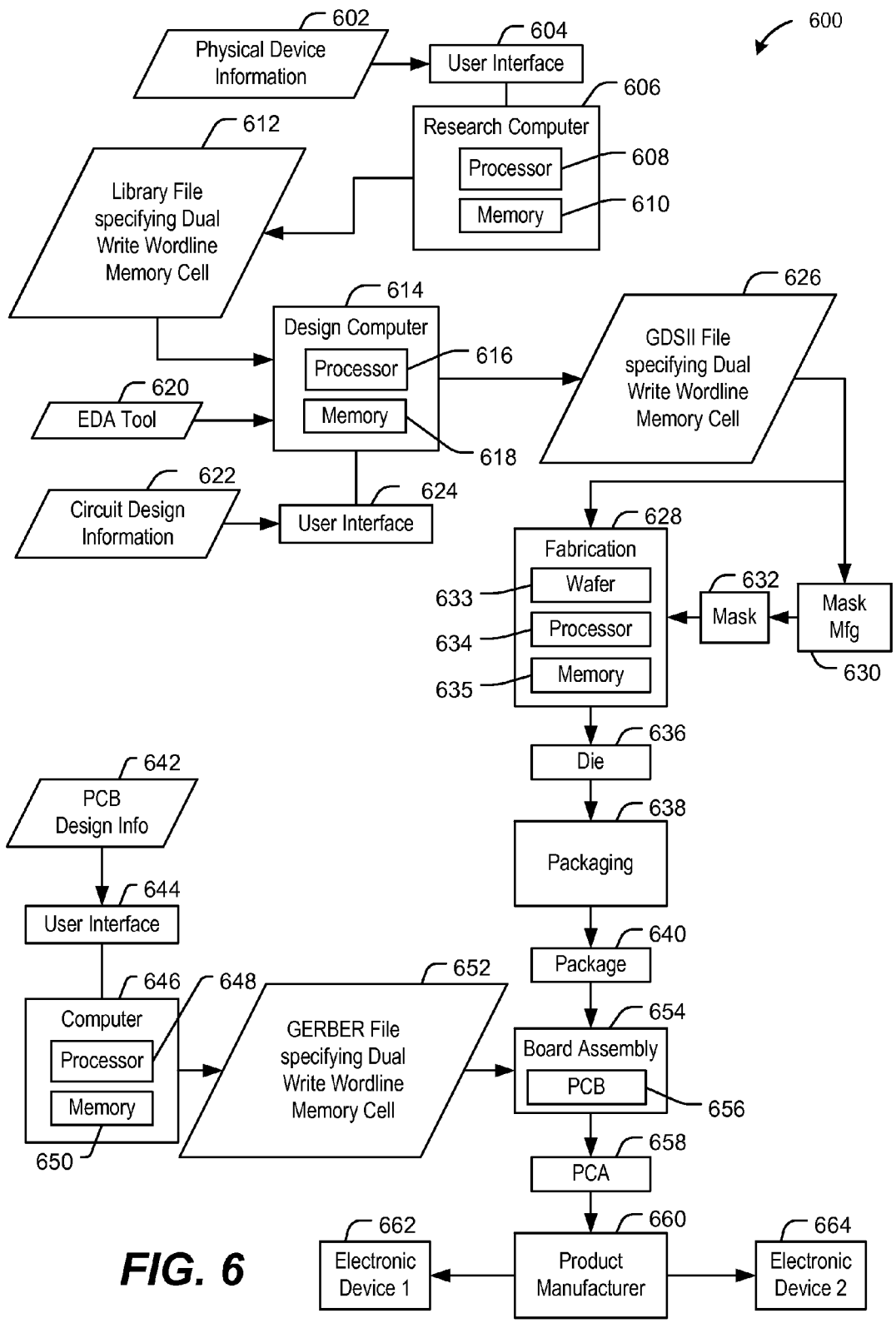
FIG. 6 is a data flow diagram of a particular illustrative embodiment of a manufacturing process to manufacture electronic devices that include a dual write wordline memory cell.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative embodiment of an electronic device manufacturing process 600.

Referring to FIG. 6, a particular embodiment of a manufacturing process 600 to manufacture electronic devices that include a dual write wordline memory cell is shown. Physical device information 602 is received at the manufacturing process 600, such as at a research computer 606. The physical device information 602 may include design information representing at least one physical property of a semiconductor device, such as the dual write wordline memory cell 100 of FIG. 1, the array of dual write wordline memory cells of memory device 200 of FIG. 2, or the dual write wordline memory cell 502 of FIG. 5, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including a device that includes the dual write wordline memory cell 100 of FIG. 1, the array of dual write wordline memory cells of memory device 200 of FIG. 2, or the dual write wordline memory cell 502 of FIG. 5, or any combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the dual write wordline memory cell 100 of FIG. 1, the array of dual write wordline memory cells of memory device 200 of FIG. 2, or the dual write wordline memory cell 502 of FIG. 5, or any combination thereof, of the library file 612. For example, a user of the design computer 614 may enter circuit design information 622 via a user interface 624 coupled to the design computer 614. The circuit design information 622 may include design information representing at least one physical property of a semiconductor device, such as the dual write wordline memory cell 100 of FIG. 1, the array of dual write wordline memory cells of memory device 200 of FIG. 2, or the dual write wordline memory cell 502 of FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the dual write wordline memory cell 100 of FIG. 1, the array of dual write wordline memory cells of memory device 200 of FIG. 2, or the dual write wordline memory cell 502 of FIG. 5, or any combination thereof, in addition to other circuits or information. To illustrate, the data file may include information corresponding to a system-on-chip (SOC) that includes the dual write wordline memory cell 100 of FIG. 1, the array of dual write wordline memory cells of memory device 200 of FIG. 2, or the dual write wordline memory cell 502 of FIG. 5 and that also includes additional electronic circuits and components within the SOC.

The GDSII file 626 may be received at a fabrication process 628 to manufacture the dual write wordline memory cell 100 of FIG. 1, the array of dual write wordline memory cells of memory device 200 of FIG. 2, or the dual write wordline memory cell 502 of FIG. 5, or any combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The fabrication process 628 may include a processor 634 coupled to a memory 635. The mask 632 may be used during the fabrication process 628 to generate one or more wafers 633 that may be tested and separated into dies, such as a representative die 636. The die 636 includes a circuit including a device that includes the dual write wordline memory cell 100 of FIG. 1, the array of dual write wordline memory cells of memory device 200 of FIG. 2, or the dual write wordline memory cell 502 of FIG. 5, or any combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the dual write wordline memory cell 100 of FIG. 1, the array of dual write wordline memory cells of memory device 200 of FIG. 2, or the dual write wordline memory cell 502 of FIG. 5, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the dual write wordline memory cell 100 of FIG. 1, the array of dual write wordline memory cells of memory device 200 of FIG. 2, or the dual write wordline memory cell 502 of FIG. 5, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. As another illustrative, non-limiting example, the first representative electronic device 662, the second representative electronic device 664, or both, may be selected from the group of a tablet, a set top box, a music player, a video player, an entertainment unit, a navigation device, a communications device, a personal digital assistant (PDA), a fixed location data unit, and a computer, into which the dual write wordline memory cell 100 of FIG. 1, the array of dual write wordline memory cells of memory device 200 of FIG. 2, or the dual write wordline memory cell 502 of FIG. 5, or a system having a dual write wordline memory cell, is integrated. Although FIG. 6 illustrates remote units according to teachings of the disclosure, the disclosure is not limited to these illustrated units. Embodiments of the disclosure may be suitably employed in any device that includes active integrated circuitry including memory and on-chip circuitry.

A device that includes the dual write wordline memory cell 100 of FIG. 1, the array of dual write wordline memory cells of memory device 200 of FIG. 2, or the dual write wordline memory cell 502 of FIG. 5, or any combination thereof, may be fabricated, processed, and incorporated into an electronic device, as described in the manufacturing process 600. One or more aspects of the embodiments disclosed with respect to FIGS. 1-6 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the manufacturing process 600 may be performed by a single entity or by one or more entities performing various stages of the manufacturing process 600.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A static random-access memory (SRAM) memory cell comprising:
   a pair of cross-coupled inverters, wherein each inverter of the pair of cross-coupled inverters includes at least two transistors; and
   a gating transistor coupled to a first node of a first inverter of the pair of cross-coupled inverters, wherein a gate of the gating transistor is coupled to a first write wordline, wherein the gating transistor is configured to selectively couple a write bitline to the first node of the first inverter responsive to a first wordline signal, wherein a supply node of a terminal of a transistor of the first inverter is coupled to a second write wordline, wherein the first write wordline and the second write wordline are each independently controllable.

2. The SRAM memory cell of claim 1, wherein the first node corresponds to an output of the first inverter.

3. The SRAM memory cell of claim 1, wherein a drain terminal of the transistor of the first inverter is coupled to the gating transistor.

4. The SRAM memory cell of claim 3, wherein a second transistor of the at least two transistors of the first inverter is a p-type metal-oxide-semiconductor (PMOS) transistor.

5. The SRAM memory cell of claim 3, wherein the transistor of the first inverter is an n-type metal-oxide-semiconductor (NMOS) transistor.

6. The SRAM memory cell of claim 1, further comprising a read buffer coupled to a third node of the first inverter.

7. The SRAM memory cell of claim 6, wherein the third node corresponds to an input of the first inverter.

8. The SRAM memory cell of claim 6, wherein the pair of cross-coupled inverters, the gating transistor, and the read buffer correspond to a seven-transistor memory cell architecture.

9. The SRAM memory cell of claim 6, wherein the pair of cross-coupled inverters, the gating transistor, and the read buffer correspond to a single write bitline memory cell architecture.

10. The SRAM memory cell of claim 1, wherein the first write wordline and the second write wordline are configured to assert the same logical values during a first phase of a write operation and different logical values during a second phase of the write operation.

11. The SRAM memory cell of claim 1, wherein the supply node of the terminal of the transistor of the first inverter is configured to receive a biasing voltage of the second write wordline.

12. The SRAM memory cell of claim 1, integrated in at least one memory array.

13. The SRAM memory cell of claim 1, integrated in at least one die.

14. The SRAM memory cell of claim 1, further comprising a device that includes at least one of a mobile phone, a tablet, a set top box, a music player, a video player, an entertainment unit, a navigation device, a communications device, a personal digital assistant (PDA), a fixed location data unit, and or a computer, into which the pair of cross-coupled inverters and the gating transistor are integrated.

15. A method comprising:
   during a first phase of a write operation of a memory cell that comprises a pair of cross-coupled inverters, wherein each inverter of the pair of cross-coupled inverters includes at least two transistors:
       applying a first signal to a first write wordline to selectively couple a write bitline to a first node of a first inverter of the pair of cross-coupled inverters;
       applying a second signal to a second write wordline that is coupled to a supply node of a terminal of a transistor of the first inverter, wherein the first signal is independently generated from the second signal; and
       applying a third signal to the write bitline.

16. The method of claim 15, wherein the second signal has a voltage value that corresponds to a source voltage of the first inverter.

17. The method of claim 15, wherein the first signal, the second signal, or both, is a voltage-boosted signal.

18. The method of claim 15, wherein the memory cell corresponds to a static random-access memory (SRAM) memory cell.

19. The method of claim 15, wherein applying the first signal to the first write wordline, applying the second signal to the second write wordline, and applying the third signal to the write bitline are initiated by a processor integrated into an electronic device.

20. A method comprising:
   during a first phase of a write operation of a memory cell that comprises a pair of cross-coupled inverters:
       applying a first signal to a first wordline to selectively couple a bitline to a first node of a first inverter of the pair of cross-coupled inverters;
       applying a second signal to a second wordline that is coupled to a second node of the first inverter, wherein the first signal is independently generated from the second signal; and
       applying a third signal to the bitline; and
   during a second phase of the write operation of the memory cell:
       applying a fourth signal to the second wordline; and
       applying, based on a data value, a fifth signal to the bitline.

21. The method of claim 20,
   wherein the first phase of the write operation of the memory cell is performed on each memory cell of a memory row that includes the memory cell,
   wherein the second phase of the write operation of the memory cell is selectively performed on memory cells of the memory row, and
   wherein each other memory cell of the memory row stores a corresponding data value.

22. The method of claim 21, wherein the memory row is integrated in a memory array.

23. The method of claim 21, wherein the first phase of the write operation corresponds to writing a logical high value to each memory cell of the memory row, and wherein the second phase of the write operation corresponds to selectively writing a logical low value to memory cells of the memory row.

24. The method of claim 21, wherein the first phase of the write operation corresponds to writing a logical low value to each memory cell of the memory row, and wherein the second phase of the write operation corresponds to selectively writing a logical high value to memory cells of the memory row.

25. An apparatus comprising:
first means for inverting including a first pair of transistors;
second means for inverting including a second pair of transistors, wherein the first means for inverting and the second means for inverting are cross-coupled; and
means for switching coupled to a first node of the first means for inverting, wherein a control input of the means for switching is coupled to a first write wordline, wherein the means for switching selectively couples a write bitline to the first node of the first means for inverting responsive to a first wordline signal, wherein a supply node of a terminal of a transistor of the first means for inverting is coupled to a second write wordline, wherein the first write wordline and the second write wordline are each independently controllable.

26. The apparatus of claim 25, integrated in at least one die.

27. The apparatus of claim 25, further comprising a device that includes at least one of a mobile phone, a tablet, a set top box, a music player, a video player, an entertainment unit, a navigation device, a communications device, a personal digital assistant (PDA), a fixed location data unit, or a computer, into which the first means for inverting and the second means for inverting is integrated.

28. A non-transitory computer readable medium storing instructions that, when executed by a processor, cause the processor to:
during a first phase of a write operation of a memory cell that comprises a pair of cross-coupled inverters, wherein each inverter of the pair of cross-coupled inverters includes at least two transistors:
initiate application of a first signal to a first write wordline to selectively couple a write bitline to a first node of a first inverter of the pair of cross-coupled inverters;
initiate application of a second signal to a second write wordline that is coupled to a supply node of a terminal of a transistor of the first inverter of the pair of cross-coupled inverters, wherein the first signal is independently generated from the second signal; and
initiate application of a third signal to the write bitline.

29. The non-transitory computer readable medium of claim 28, integrated in at least one die.

30. The non-transitory computer readable medium of claim 28, further comprising a device that includes at least one of a mobile phone, a tablet, a set top box, a music player, a video player, an entertainment unit, a navigation device, a communications device, a personal digital assistant (PDA), a fixed location data unit, or a computer, into which the non-transitory computer readable medium is integrated.

* * * * *